United States Patent
Hanna et al.

(10) Patent No.: US 9,372,949 B1
(45) Date of Patent: Jun. 21, 2016

(54) GUIDED EXPLORATION OF CIRCUIT DESIGN STATES

(75) Inventors: Ziyad Hanna, Haifa (IL); Craig Franklin Deaton, Rowlett, TX (US); Kathryn Drews Kranen, Menlo Park, CA (US); Björn Håkan Hjort, Göteborg (SE); Lars Lundgren, Göteborg (SE)

(73) Assignee: Cadence Design Systems, Inc., San Jose, CA (US)

( * ) Notice: Subject to any disclaimer, the term of this patent is extended or adjusted under 35 U.S.C. 154(b) by 32 days.

(21) Appl. No.: 13/280,955

(22) Filed: Oct. 25, 2011

Related U.S. Application Data (63) Continuation of application No. 13/115,820, filed on May 25, 2011, now abandoned.

(51) Int. Cl.
*G06F 17/50* (2006.01)
*G06F 9/455* (2006.01)
*G06F 11/07* (2006.01)

(52) U.S. Cl.
CPC .......... *G06F 17/504* (2013.01); *G06F 17/5022* (2013.01); *G06F 9/455* (2013.01); *G06F 11/079* (2013.01); *G06F 17/5045* (2013.01)

(58) Field of Classification Search
None
See application file for complete search history.

(56) References Cited

U.S. PATENT DOCUMENTS

| | | | |
|---|---|---|---|
| 6,587,998 B2* | 7/2003 | Rodeh | 716/106 |
| 7,028,279 B2* | 4/2006 | Jain et al. | 716/106 |
| 7,246,331 B2* | 7/2007 | Ward | 716/106 |
| 7,406,405 B2* | 7/2008 | McMillan et al. | 703/2 |
| 7,685,547 B1* | 3/2010 | Gupta et al. | 716/106 |
| 7,742,907 B2* | 6/2010 | Gupta et al. | 703/14 |
| 7,743,350 B2* | 6/2010 | Prasad | 716/106 |
| 7,921,411 B2* | 4/2011 | Chockler et al. | 717/126 |
| 2006/0173666 A1* | 8/2006 | Jain et al. | 703/14 |

OTHER PUBLICATIONS

Agbaria, S. et al., "SAT-based Semiformal Verification of Hardware," *Formal Methods in Computer-Aided Design*, Oct. 2010, pp. 25-32.
Ganai, M. et al., "Siva: A System for Coverage-directed State Space Search," J. Electron. Test, 2001, pp. 11-27, vol. 17, No. 1.
Ho, C.R. et al., "Post-Silicon Debug Using Formal Verification Waypoints," *DVCon*, 2009, seven pages.
Kuehlmann, K. et al., "Probabilistic State Space Search," *International Conference on Computer-Aided Design (ICCAD)*, 1999, pp. 574-579.
Yalagandula, V. et al., "Automatic Lighthouse Generation for Directed State Space Search," *Design, Automation and Test in Europe (DATE)*, 2000, pp. 237-242.

\* cited by examiner

*Primary Examiner* — A. M. Thompson
(74) *Attorney, Agent, or Firm* — Vista IP Law Group, LLP (57) ABSTRACT

A model checking tool, which is used to test a circuit design, attempts to reach a target state from an initial state in the state-space of the circuit design using one or more intermediate states. Through an iterative process, the tool identifies intermediate states in the state-space of the circuit design that are used to generate starting states for subsequent iterations of the process. The intermediate states help to restrict the scope of the state-space search to reduce the time and memory requirements needed to reach the target state. The model checking tool also explores the state-space in parallel from a subset of computed restart states, which reduces the possibility of bypassing any essential intermediate or target states.

20 Claims, 9 Drawing Sheets

GUIDED EXPLORATION OF CIRCUIT DESIGN STATES

CROSS REFERENCE TO RELATED APPLICATIONS

This application is a continuation application of, and claims priority under 35 U.S.C. §120 from, U.S. patent application Ser. No. 13/115,820, entitled "Guided Exploration of Circuit Design States," filed on May 25, 2011, the subject matter of which is incorporated by reference herein in its entirety.

BACKGROUND

The present disclosure relates generally to testing of circuit designs, and more particularly to guided exploration of circuit design states.

Circuit designs with digital logic can be represented as finite state machines. A finite state machine for a circuit design can be visualized as a directed graph that comprises nodes and edges connecting the nodes. The nodes represent states of the circuit design, and the edges represent transitions between the states of the circuit design. Exploring the state-space of a circuit design has a number of useful purposes, such as verifying properties of the circuit design, justifying the reachability of a given state for an equivalence checker, generating tests to satisfy missing coverage, analyzing RTL code to understand behavior, etc.

One technique for exploring the state-space of a circuit design is known as bounded model checking (BMC). BMC techniques attempts to exhaustively check all possible behaviors of the circuit design by starting at particular state and exploring all states that are reachable from that state within a fixed number of steps. However, one of the most serious challenges with model checking techniques is the state-space explosion problem. As the size and complexity of a circuit design grows, so do the number of states that need to be explored. The state-space for a circuit design can be very large, making it impossible to explore the entire state-space with limited resources of time and memory. As a result, conventional BMC techniques are useful for hitting shallow target states, but are unable to explore deep into the state-space for large circuit designs.

SUMMARY

Embodiments of the invention enable testing of a circuit design in a way that mitigates the state-space explosion problem described above. In one embodiment, a model checking tool receives a circuit design encoded in a hardware description language. The model checking tool also obtains a target state definition and one or more intermediate state definitions. In an iterative process, the model checking tool explores the state space of the circuit design to identify intermediate states that satisfy the intermediate state definitions and to identify a target state that satisfies the target state definition. At each of a plurality of stages in the process, the model checking tool explores this state-space in parallel from a plurality of starting points in the state-space of the circuit design. For example, at least one of the starting points of a particular stage may be determined from the intermediate states. The model checking tool then outputs a result of the exploration that shows a path from a starting state to a target state, for example, by outputting a trace that leads to the target state.

The intermediate states are useful for guiding the state-space exploration of the circuit design towards the target state. The use of intermediate states reduces the number of states that are explored before the target state is reached, which allows deeper searches into the state-space of the circuit design. However, using intermediate states to restrict the scope of the state-space search may increase the risk that important portions of the state-space are missed. This risk is mitigated through the use of various techniques, such as by searching the state-space in parallel from a plurality of starting points in the state-space of the circuit design.

The figures depict various embodiments of the present disclosure for purposes of illustration only. One skilled in the art will readily recognize from the following discussion that alternative embodiments of the structures and methods illustrated herein may be employed without departing from the principles described herein.

DETAILED DESCRIPTION

Tool Flow for State Exploration

Figure 1:
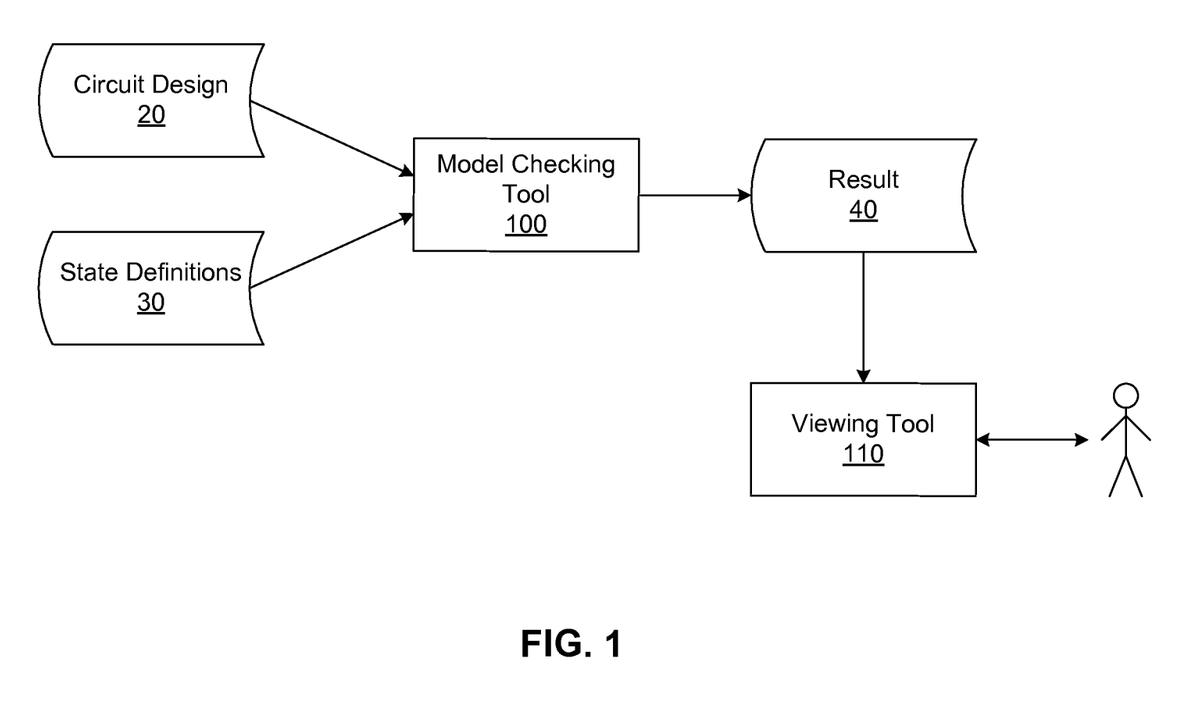
FIG. 1 is a diagram of a state space exploration in accordance with an embodiment.

FIG. 1 illustrates an embodiment of a flow for testing the behavior of a circuit design 20. The circuit design 20 may be embodied in a data file encoded using a hardware description language (HDL), which may describe the structural design and operation of a circuit. The state definitions 30 include definitions for various states of the circuit design, such as an initial state definition, a target state definition, and intermediate state definitions. Each state definition may, for example, specify values for one or more registers of the circuit design 20 (e.g., A=1 & B=1), or express a functional relationship between the registers of the circuit design 20 (e.g., A<>B).

In one embodiment, a state of the circuit design comprises of values for registers of a circuit design during one clock cycle. A state of a circuit design may satisfy a state definition, for example, if the register values of the state match the register values specified in the state definition or satisfy the function expressed by the state definition. In some embodiments, a state definition can be satisfied by more than one actual concrete state of the circuit design. For example, a circuit design may include five registers, but the target state definition may only specify values for four of the five registers while omitting the definition for the fifth register. Thus, there are two potential states of the circuit design (e.g., the fifth register can be 0 or 1) that satisfy the target state definition.

An initial state is a state of the circuit design that satisfies the initial state definition. Alternatively, the initial state can be reached by executing a set of inputs that cause the circuit design to enter the initial state, and is sometimes referred to as a reset state. In one embodiment, the initial state definition is provided by the user or computed with a self-alignability analysis. A target state is a state of the circuit design that satisfies the target state definition. The target state may or may not be reachable from the initial state of the circuit design. In one embodiment, a circuit designer may specify the target state definition for the purposes of analyzing the behavior of the circuit design 20, for example, to determine if a target state can be reached from the initial state, and if so, how the target state was reached from the initial state.

Intermediate states are states of the circuit design that satisfy the intermediate state definitions. Intermediate states are believed to be states of the circuit design that exist along the path between the reset state and the target state. The intermediate state definitions may be created by a user (e.g., a circuit designer) that is familiar with the operation of the circuit design 20 being tested to help guide the model checking tool 100 in identifying a path between the initial state and a target state. In other embodiments, the intermediate state definitions may be computed through an automatic process.

The circuit design 20 and state definitions 30 are provided to a model checking tool 100. The model checking tool 100 may convert the circuit design 20 into an internal representation that is appropriate for exploring the state-space of the circuit design 20. The model checking tool 100 then explores the state-space of the circuit design 20 to determine whether a path exists between the initial state and a target state. In one embodiment, the model checking tool 100 begins at the initial state and traverses the state-space 20 of the circuit design along intermediate states in an attempt to reach a target state. The model checking tool 100 restarts the search at each intermediate state to reduce the size of the state-space search, while also searching the state-space in parallel from multiple starting points to avoid missing any intermediate states or target states.

The model checking tool 100 then outputs a result 40 of model checking process. The result 40 of the model checking process may comprise an indication of whether or not a target state can be reached. If a target state can be reached, the result may comprise a trace or input sequence that shows how the target state can be reached from the initial state. Even if the target state cannot be reached, the result may comprise a trace of a path between the initial state and one or more of the intermediate states. The result 40 of the model checking tool 100 may be stored in memory, passed along to another software process, or displayed to the user. A viewer 110 may also be included to display the trace to a circuit designer. This can facilitate understanding of what aspect of the HDL code in the circuit design 20 is responsible for the behavior in the trace.

Guided Exploration of the State-Space of a Circuit Design

Figure 2A:
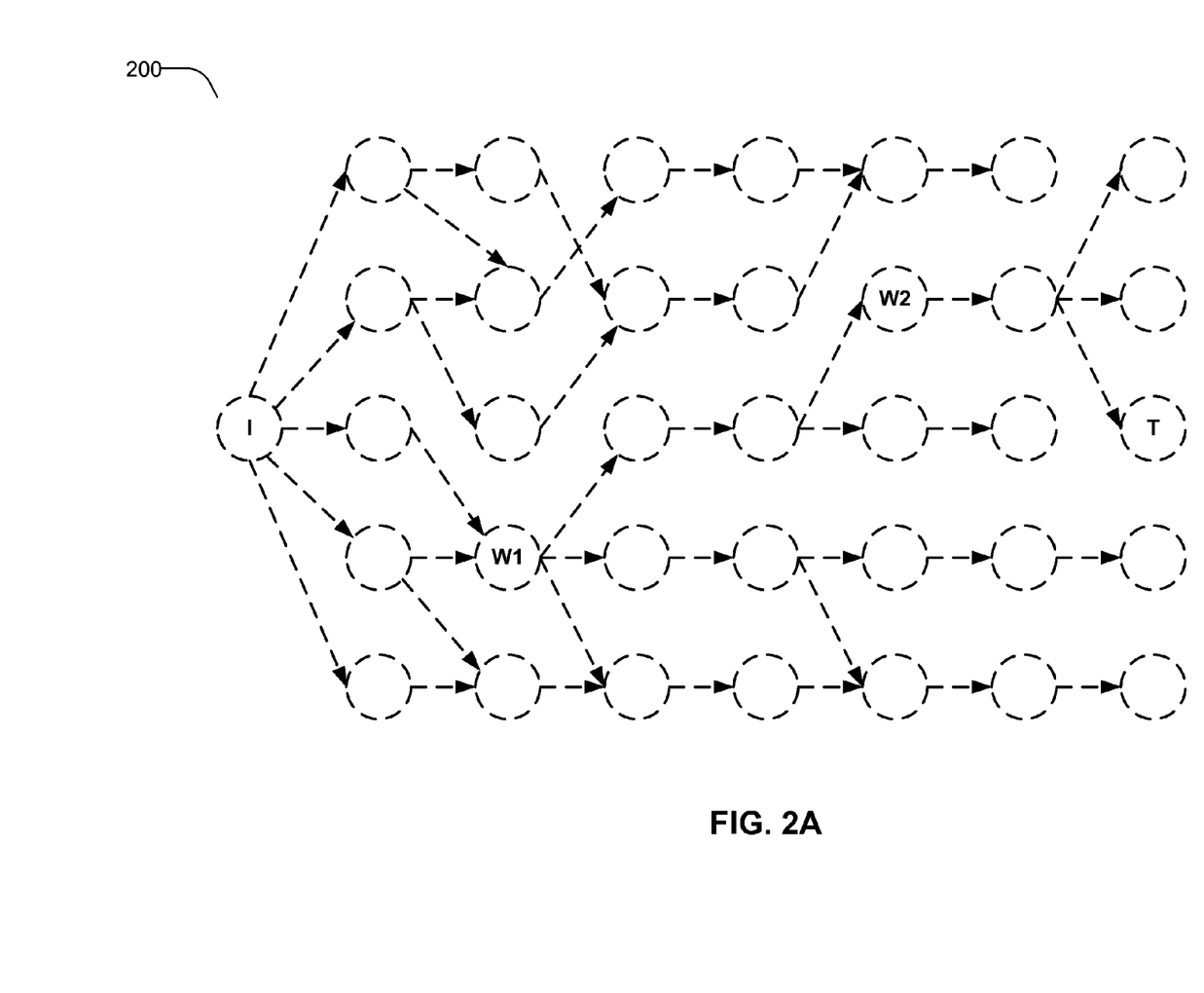
FIGS. 2A, 2B, 2C and 2D illustrate a state space of a circuit design in accordance with an embodiment.

FIGS. 2A-2D illustrate a process of exploring the state space of a circuit design according to an embodiment. As shown in FIG. 2A, the state space 200 of a circuit design includes a large number of states, such as an initial state I, intermediate state W1, intermediate state W2, and target state T. Generally speaking, the model checking tool 100 attempts to identify a path between the initial state I and the target state T. Initially it is not known how to reach target state T from the initial state I, or if any valid path even exists at all. The model checking tool 100 uses intermediate states (e.g., W1 and W2) to guide it from the initial state I to the target state T. In one embodiment, the model checking tool 100 can viewed as iteratively applying a BMC technique to hop from one intermediate state (e.g., W1) to another (e.g., W2) until it reaches the target state T.

Figure 2B:
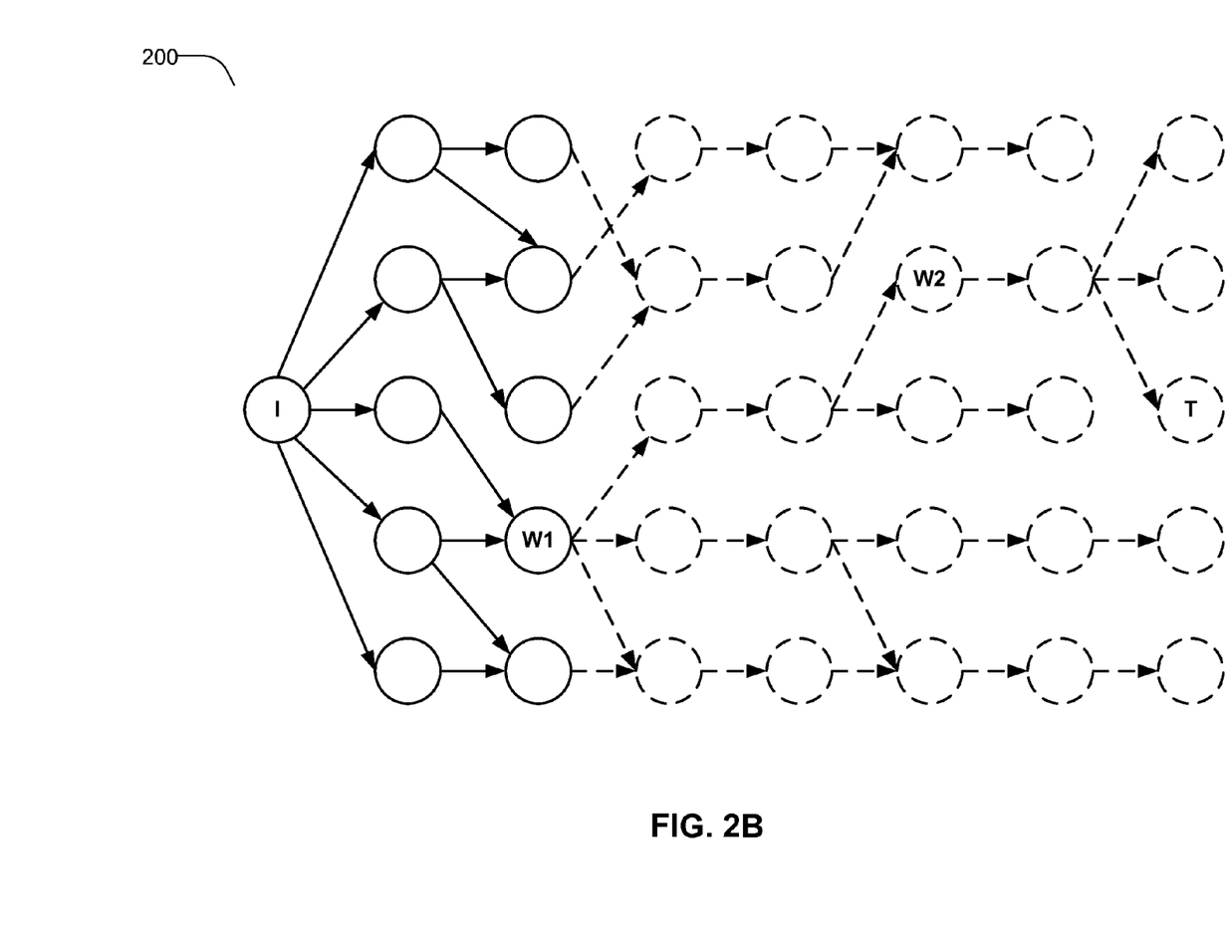

Referring to FIG. 2B, the model checking tool 100 starts at the initial state I and explores the state-space of the circuit design in an attempt to reach the first intermediate state W1. The states drawn with solid lines represent states that are explored by the model checking tool 100, and the states drawn with broken lines represent states that are not explored by the model checking tool 100. As shown, the model checking tool 100 needs only to explore a portion of the state-space 200 that is within two steps of the initial state I before reaching intermediate state W1.

Figure 2C:
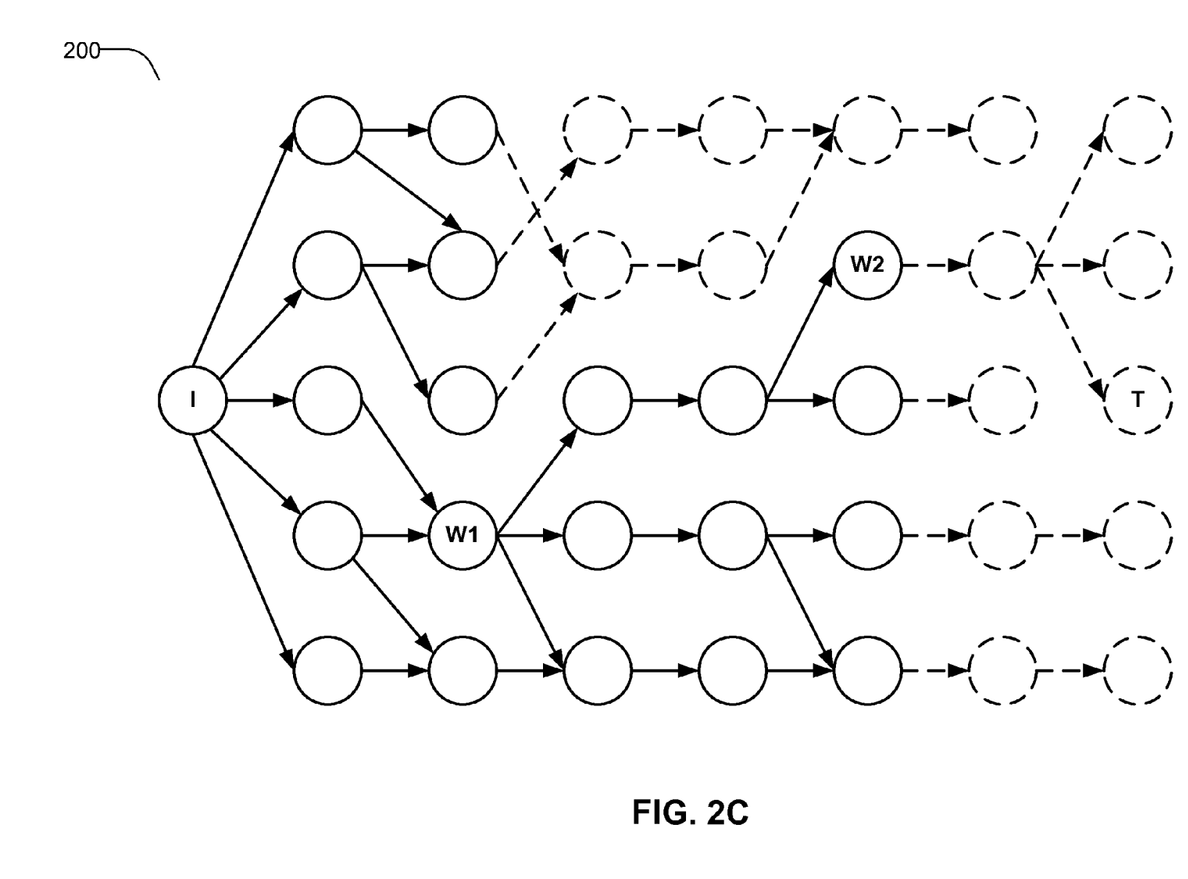

Referring to FIG. 2C, once the first intermediate state W1 is reached, the model checking tool restarts the search from the first intermediate state W1. The model checking tool explores the states that are reachable from intermediate state W1 in an attempt to reach the second intermediate state W2. The number of states drawn with solid lines in FIG. 2C is increased when compared with FIG. 2B to represent states that are explored by the model checking tool 100 before reaching the second intermediate state W2.

Figure 2D:
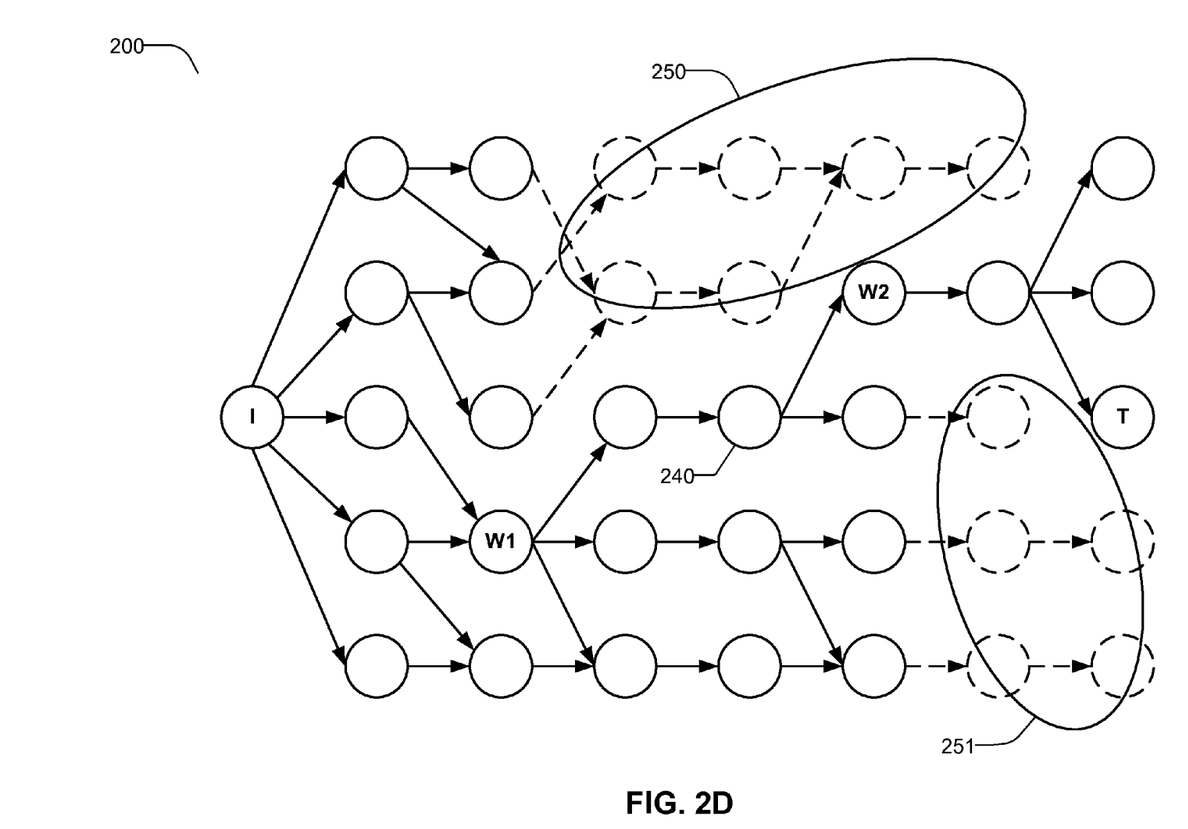

Referring to FIG. 2D, once intermediate state W2 is reached, the model checking tool 100 restarts the search from intermediate state W2. The model checking tool 100 explores the states that are reachable from intermediate state W2 in an attempt to reach target state T. The number of states drawn with solid lines in FIG. 2D is increased when compared with FIG. 2C to represent states that are explored by the model checking tool 100 before reaching the second intermediate state W2. Once the target state T is reached, the process is complete and a trace is generated for the path that leads to the target state T.

The use of intermediate states to guide the exploration of the state-space 200 is beneficial for reducing the number of states that need to be explored by the model checking tool 100. Without the use of intermediate states, the entire state-space 200 shown in FIG. 2D would be explored before reaching the target state T. By restarting the search at each intermediate state, large portions of the state space (e.g., portions 250 and 251) do not need to be explored in reaching the target state T, reducing both memory and time required to analyze the circuit design.

Figure 3:
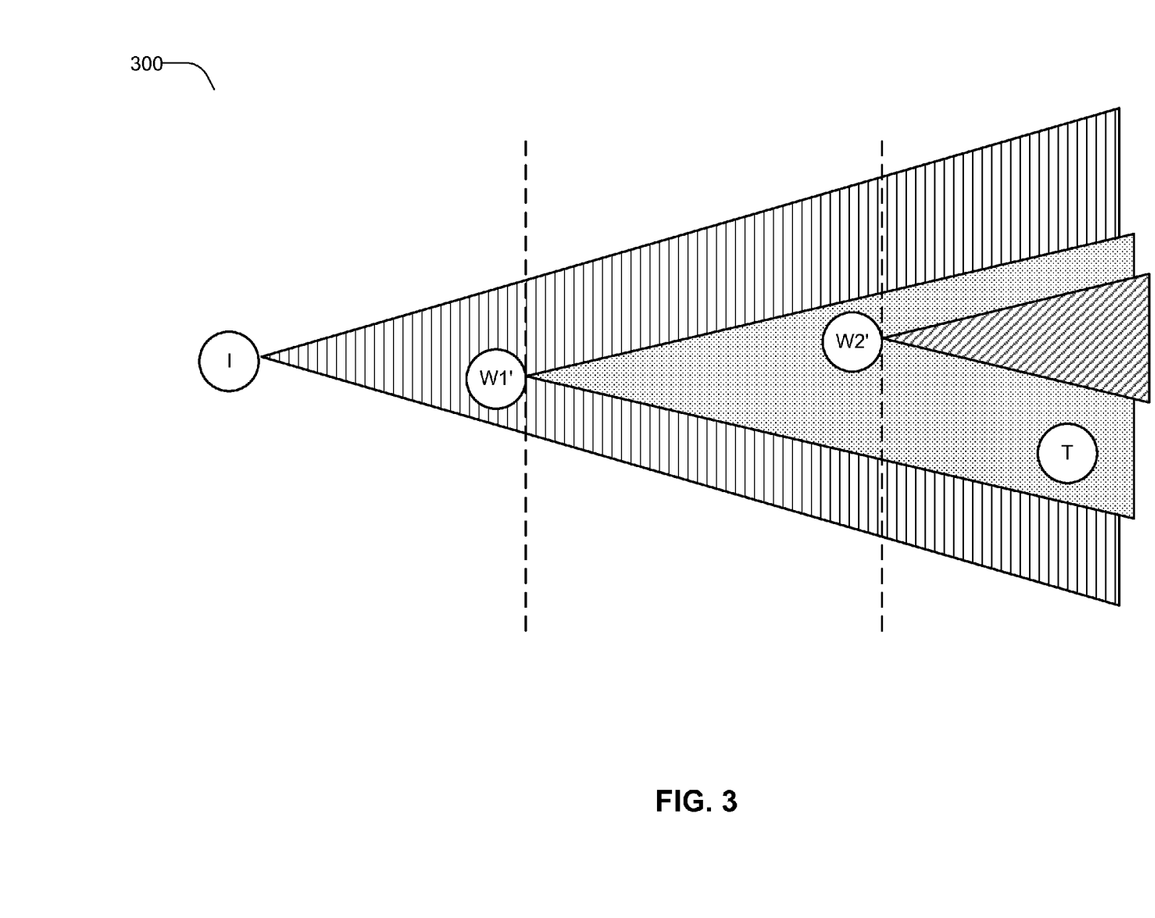
FIG. 3 illustrates a state space of a circuit design in accordance with an embodiment.

FIG. 3 illustrates a process for exploring a state space of a circuit design in parallel from multiple starting states, according to one embodiment. The state space 300 in FIG. 3 is similar to the state space 200 in FIG. 2, except that the illustration of the state space 300 is simplified and only four states are shown: an initial state I, new intermediate state W1', new intermediate state W2', and target state T. The cones extending from each state indicate the states that are reachable from that state. From the initial state I, both intermediate states W1' and W2' and the target state T can be reached. From intermediate state W1', intermediate state W2' and target state T can be reached. From intermediate state W2', target state T cannot be reached.

In one embodiment, the model checking tool 100 runs several instances of a model checker in parallel when exploring the state-space 300 of the circuit design. Each instance of the model checker searches the state-space 300 of the circuit design (e.g., with BMC) by starting from a different state in the state space 300 of the circuit design. In one embodiment, the model checking tool 100 maintains a list of potential starting states for exploring the state space 300 of the circuit design. Initially, the only potential starting state is the initial state I. When new intermediate states are located, the intermediate states are added to the list of potential starting states. Furthermore, when new intermediate states are located, the model checking tool 100 selects multiple states from the list of potential starting states and initiates an instance of the model checker for each of the selected states. The different instances of the model checker execute in parallel so that the state-space of the circuit design is simultaneously explored in parallel from more than one starting state.

For example, referring still to FIG. 3, suppose the model checking tool 100 is configured for parallel execution of two instances of a model checker. Initially, the only potential starting state is the initial state I. The model checking tool 100 initiates a single instance of the model checker from the initial state I in an attempt to identify intermediate state W1'. Once intermediate state W1' is located, it is added to the list of potential starting states. The model checking tool then restarts the search by initiating two instances of the model checker, one from initial state I, and another from intermediate state W1', and runs both instances in parallel in an attempt to find intermediate state W2'. Once intermediate state W2' is reached (from either instance of the model checker), intermediate state W2' is added to the list of potential starting states so that the list of potential starting states now includes initial state I, intermediate state W1', and intermediate state W2'. The model checking tool 100 then restarts the search by initiating two instances of the model checker, and the starting states for the model checking tool 100 are selected from among the initial state I, intermediate state W1', and intermediate state W2'. Both instances of the model checker are executed in parallel in an attempt to find target state T.

Concurrently searching the state-space of the circuit design from multiple starting points is beneficial for increasing the state space coverage and thus decreasing the likelihood that additional intermediate states or target states will not be accidentally missed. For example, if the model checking tool 100 only used the most recently identified intermediate state (e.g., W2') to search the state-space of the circuit design, the target state T would never be reached even though it is accessible from the initial state I. The inaccuracies in the intermediate states may be caused by a number of factors. First, the user may have mistakenly provided the wrong intermediate state definition. Second, as already mentioned, intermediate state definitions are often abstract enough to cover multiple states of the circuit design. Some of the states meeting the intermediate state definition may lie on a path between the initial state I and the target state T, whereas other states that meet the same definition may not lie on the path. Thus, the model checking tool 100 may have unknowingly stumbled upon a intermediate state, such as intermediate state W2', that meets the intermediate state definition but can never lead to the target state T because it lies on the wrong path.

In one embodiment, when searching from multiple starting states in parallel, the model checking tool selects only a subset of the potential starting states for initiating instances of a model checker. The number of starting states that are selected can be set to some default number (e.g., 2 or 3) or configured by a user of the model checking tool. In one embodiment, the model checking tool 100 selects the starting states that were most recently identified by the model checking tool 100. For example, still referring to FIG. 3, initial state I and intermediate state W1' may be the starting points selected by the model checking tool 100 until intermediate state W2' is reached. Then, intermediate state W1' and intermediate state W2' would be selected as the starting points. In other embodiments, there are several possible heuristics available for choosing the starting states from the list of potential starting states, and the user of the model checking tool has the ability to select the desired heuristic.

In one embodiment, when a intermediate state is reached by the model checking tool, the intermediate state itself is not added to the list of potential starting points. Instead, the tool "backs up" from the intermediate state and selects a state that precedes the intermediate state by one or more steps in the state-space as a potential starting point. The back-up state can be identified by tracing backwards from the intermediate state along the path that lead to the intermediate state. For example, referring back to FIG. 2D, when intermediate state W2 is reached, the tool may select state 240 as a potential starting point for exploring the state-space 200 of the circuit design instead of intermediate state W2. The backup distance (e.g., 1, 2, or 3 states) can be a pre-determined distance that is set according to a default value or configured by a user of the model checking tool. Backing up in this manner expands the scope of states that can be reached when compared the original intermediate state W2.

In one embodiment, the intermediate state definitions are ordered according to their priority and the model checking tool follows the order specified by the intermediate state definitions when identifying intermediate states. In other words, the engine attempts to identify intermediate states that satisfy higher priority intermediate state definitions before attempting to identify intermediate states that satisfy lower priority intermediate state definitions. For example, referring again to FIG. 3, supposed that the state definition for intermediate state W1' has a higher priority than the state definition for intermediate state W2'. Starting at the initial state I, the tool first attempts to reach intermediate state W1'. It is not until intermediate state W1' is reached that the tool attempts to reach intermediate state W2'. In one embodiment, the model checking tool also attempts to identify all intermediate states (e.g. both W1' and W2') before attempting to reach the target state T.

In another embodiment, the intermediate state definitions are un-ordered, and model checking tool simply attempts to identify any of the intermediate states or target state when exploring the state-space of the circuit design. Intermediate states that are reached are added to the list of potential starting points, and the process is complete once the target state T is reached. For example, referring still to FIG. 3, when starting from the initial state I, the model checking tool attempts to reach either intermediate state W1', intermediate state W2', or target T regardless of whether W1' has been reached. If intermediate state W2' is somehow reached before intermediate state W1', intermediate state W2' is added as a potential starting state. The model checking tool 100 then restarts the search from intermediate state W2' in an attempt to reach either intermediate state W1' or target T.

In one embodiment, after a new intermediate state is identified, the model checking tool terminates all existing instances of the model checkers. After the starting points are selected, new instances of the model checkers are initiated from the selected starting points such that the exploration of the state-space is restarted from the selected starting points. For example, suppose the state-space 300 of the circuit design is being explored from both I and W1'. When W2' is reached, both instances of the model checker are terminated. If W1' and W2' are selected as the new starting points, two new instances of the model checker are then initiated by using W1' and W2' as starting points for exploring the state-space of the circuit design.

However, in another embodiment, after a new intermediate state is identified, the model checking tool allows existing instances of the model checker to continue running Only instances of the model checker that are no longer needed are terminated. For example, suppose again that the state-space of the circuit design is being explored from both I and W1'. When W2' is reached, W1' and W2' are selected as the new starting points for the exploration. The instance of the model checker that has initial state I as its starting point is no longer needed and is thus terminated. The instance of the model checker that has intermediate state W1' as its starting point already exists, and is thus allowed to continue running (this model checker now searches for target state T). Selectively terminating the model checkers reduces duplicate exploration of the state-space 300 that may be caused by restarting a search from the exact same starting state.

Method of Operation

Figure 4A:
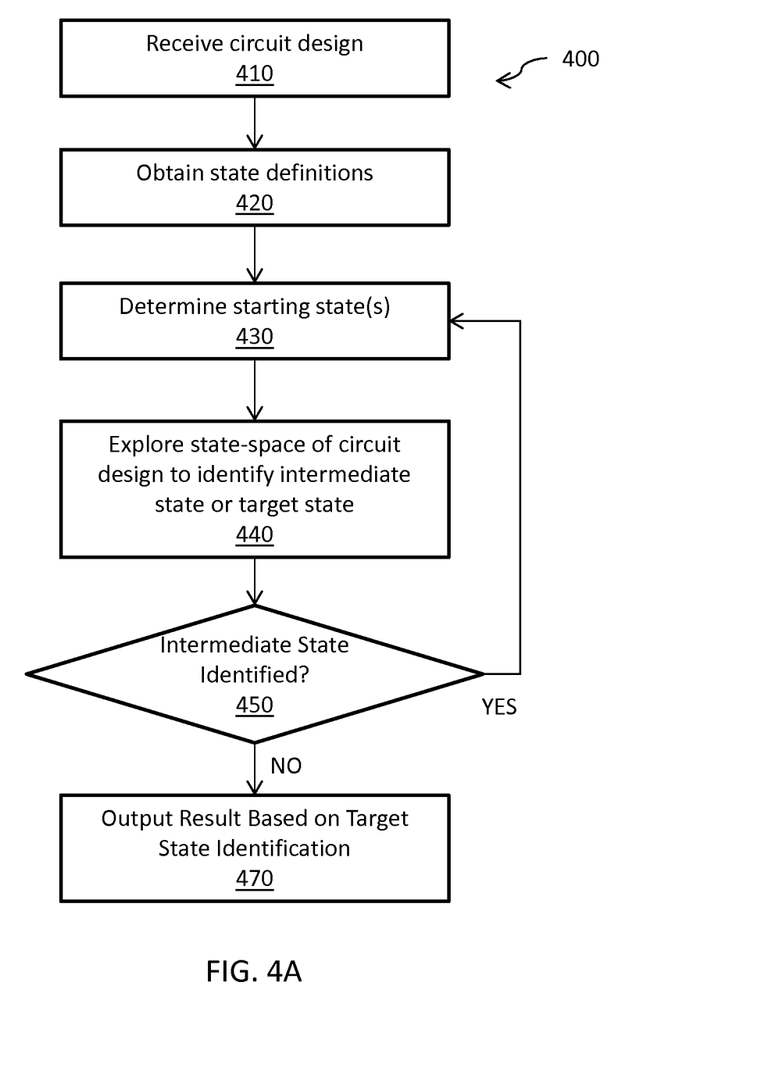
FIG. 4A is a flow chart of a state space exploration process performed by the model checking tool of FIG. 1, in accordance with an embodiment.
Figure 4B:
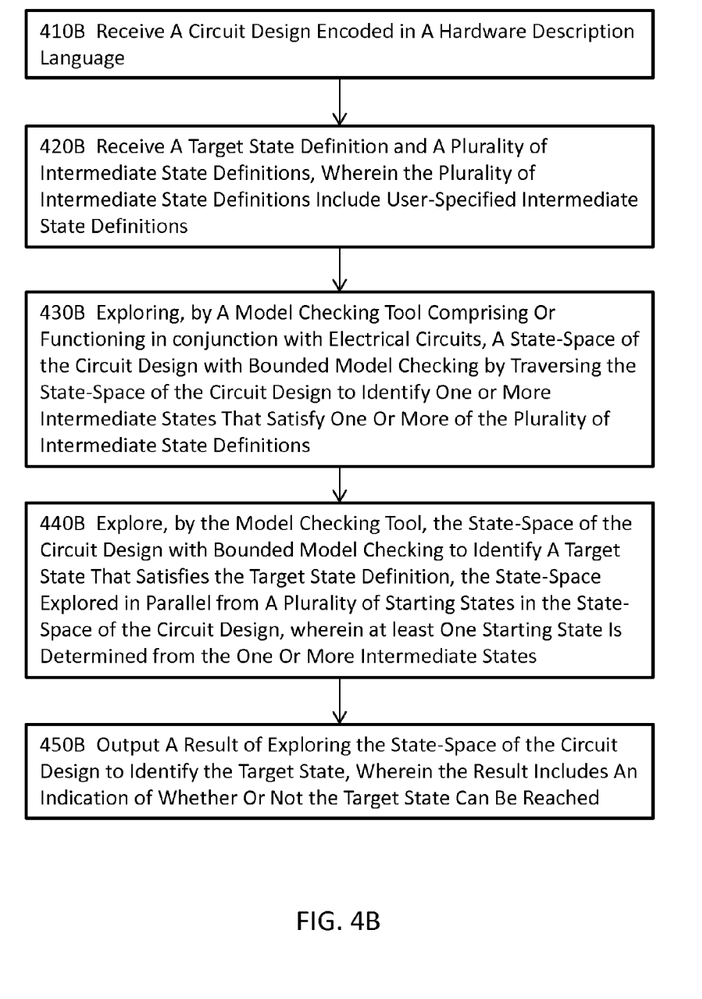
FIG. 4B illustrates a method for testing a circuit design according to some embodiments.
Figure 4C:
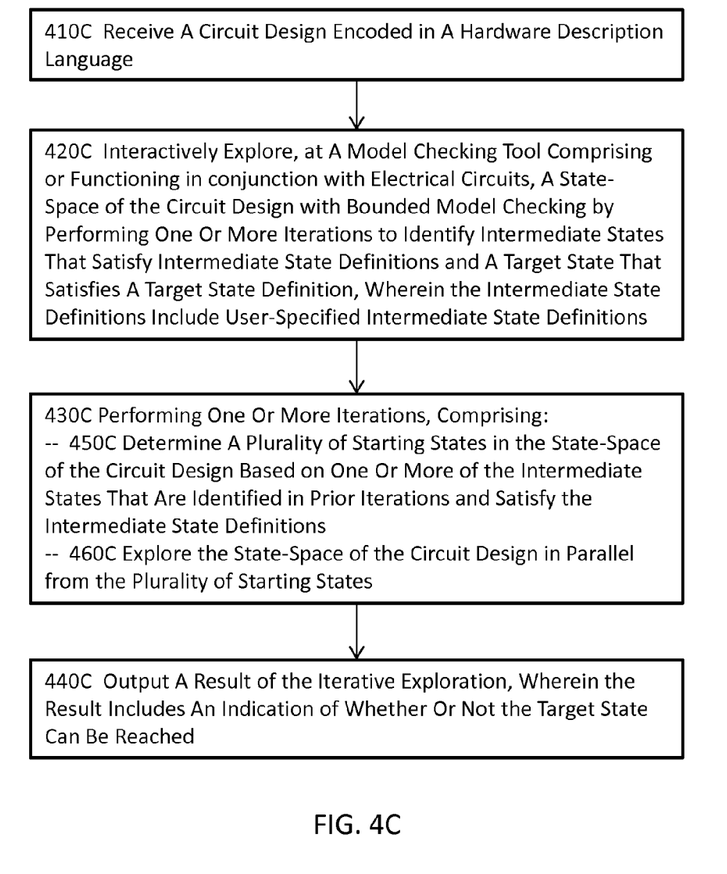
FIG. 4C illustrates another method for testing a circuit design according to some embodiments.

FIG. 4A illustrates a method 400 for exploring the state space of a circuit design according to an embodiment. In one embodiment, the steps in FIG. 4A are performed by the model checking tool 100. In step 410, the model checking tool 100 receives a circuit design that may be encoded, for example, in a hardware description language. In step 420, the model checking tool 100 obtains state definitions such as an initial state definition, a target state definition, and/or one or more intermediate state definitions. FIG. 4B illustrates a method for testing a circuit design according to some embodiments. The method includes receiving a circuit design encoded in a hardware description language at 410B, receiving a target state definition and a plurality of intermediate state definitions, wherein the plurality of intermediate state definitions include user-specified intermediate state definitions at 420B, exploring, by a model checking tool comprising or functioning in conjunction with electrical circuits, a state-space of the circuit design with bounded model checking by traversing the state-space of the circuit design to identify one or more intermediate states that satisfy one or more of the plurality of intermediate state definitions at 430B, exploring, by the model checking tool, the state-space of the circuit design with bounded model checking to identify a target state that satisfies the target state definition, the state-space explored in parallel from a plurality of starting states in the state-space of the circuit design, wherein at least one starting state is determined from the one or more intermediate states at 440B, and outputting a result of exploring the state-space of the circuit design to identify the target state, wherein the result includes an indication of whether or not the target state can be reached at 450B. FIG. 4C illustrates a method for testing a circuit design according to some embodiments. The method comprises receiving a circuit design encoded in a hardware description language at 410C, interactively exploring, at a model checking tool comprising or functioning in conjunction with electrical circuits, a state-space of the circuit design with bounded model checking by performing one or more iterations to identify intermediate states that satisfy intermediate state definitions and a target state that satisfies a target state definition, wherein the intermediate state definitions include user-specified intermediate state definitions at 420C, and outputting a result of the iterative exploration, wherein the result includes an indication of whether or not the target state can be reached at 440C. Performing one or more iterations (430C) comprises determining a plurality of starting states in the state-space of the circuit design based on one or more of the intermediate states that are identified in prior iterations and satisfy the intermediate state definitions at 450C and exploring the state-space of the circuit design in parallel from the plurality of starting states at 460C.

In step 430, the model checking tool 100 determines one or more states as starting points for exploring the state-space of the circuit design. During an initial iteration of steps 430-460, the initial state of the circuit design may be the only potential starting state that can be selected. In subsequent iterations, more starting states may become available as the intermediate states are identified during the preceding iterations. In an embodiment, the starting states may be determined to be the same as the previously identified intermediate states. In another embodiment, the starting states may precede the previously identified intermediate states by a pre-determined number of steps (e.g., 1, 2 or 3 steps) in the state-space of the circuit design.

In step 440, the model checking tool 100 explores the state-space of the circuit design to identify intermediate states and/or the target state. If more than one potential starting state is available, the model checking tool 100 searches the state-space of the circuit design concurrently from a plurality of starting states, for example, by invoking multiple instances of a model checker. In an embodiment where the intermediate state definitions are ordered, the model checking tool 100 attempts to identify states that satisfy higher ordered intermediate state definitions before attempting to identify states that satisfy lower ordered intermediate state definitions during later iterations of step 440. In one embodiment, the model checking tool 100 attempts to satisfy all intermediate state definitions before the tool attempts to identify a state of the circuit design that satisfies the target state definition.

In step 450, the model checking tool 100 determines if an intermediate state or target state was identified during the state-space search. If an intermediate state was identified, the model checking tool 100 repeats steps 430-440 to restart the search from a potentially new set of starting points. In step 470, if the target state is identified during the state-space search, the tool outputs a result, for example, a trace that leads from the initial state to the target state.

SUMMARY

The foregoing description of the embodiments has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Some embodiments may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosed embodiments are intended to be illustrative, but not limiting, of the scope of the invention, which is set forth in the following claims.

What is claimed is:

1. A method for testing a circuit design, the method comprising:
   receiving a circuit design encoded in a hardware description language;
   receiving a target state definition and a plurality of intermediate state definitions, wherein the plurality of intermediate state definitions include user-specified intermediate state definitions;
   exploring, by a model checking tool, a state-space of the circuit design with bounded model checking by traversing the state-space of the circuit design to identify one or more intermediate states that satisfy one or more of the plurality of intermediate state definitions;
   exploring, by the model checking tool, the state-space of the circuit design with bounded model checking to identify a target state that satisfies the target state definition, the state-space explored in parallel from a plurality of starting states in the state-space of the circuit design, wherein at least one starting state is determined from the one or more intermediate states; and
   outputting a result of exploring the state-space of the circuit design to identify the target state, wherein the result includes an indication of whether or not the target state is reachable.

2. The method of claim 1, wherein the plurality of intermediate state definitions are ordered, and exploring the state-space of the circuit design comprises exploring the state-space of the circuit design to satisfy higher-order definitions before exploring the state-space of the circuit design to satisfy lower-ordered definitions.

3. The method of claim 1, wherein the at least one starting state is determined to be the same as at least one intermediate state.

4. The method of claim 1, wherein the at least one starting state is determined to precede at least one intermediate state by a pre-determined number of steps in the state-space of the circuit design.

5. The method of claim 1, wherein the plurality of starting states are determined from a subset of the intermediate states corresponding to most recently identified intermediate states.

6. The method of claim 1, wherein an intermediate state definition is satisfied by a plurality of actual concrete states of the circuit design.

7. The method of claim 1, wherein a state definition specifies values for one or more registers of the circuit design or is expressed as a function of a plurality of registers of the circuit design.

8. The method of claim 1, wherein the result comprises a trace that leads to the target state.

9. The method of claim 1, further comprising receiving one or more automatic generated intermediate state definitions for exploring the state-space with the model checking tool.

10. A computer program product for testing a circuit design, the computer program product comprising a non-transitory computer-readable storage medium having computer program code stored thereupon, the computer program code, when executed by a computing system, causing the computing system to perform a method for:
   receiving a circuit design encoded in a hardware description language;
   receiving a target state definition and a plurality of intermediate state definitions, wherein the plurality of intermediate state definitions include user-specified intermediate state definitions;
   exploring, by a model checking tool, a state-space of the circuit design with bounded model checking by traversing the state-space of the circuit design to identify one or more intermediate states that satisfy the plurality of intermediate state definitions;
   exploring, at the model checking tool, the state-space of the circuit design with bounded model checking to identify a target state that satisfies the target state definition, the state-space explored in parallel from a plurality of starting states in the state-space of the circuit design, wherein at least one starting state is determined from the one or more intermediate states; and
   outputting a result of exploring the state-space of the circuit design to identify the target state, wherein the result includes an indication of whether or not the target state is reachable.

11. The computer program product of claim 10, wherein the plurality of intermediate state definitions are ordered, and exploring the state-space of the circuit design comprises exploring the state-space of the circuit design to satisfy higher-order definitions before exploring the state-space of the circuit design to satisfy lower-ordered definitions.

12. The computer program product of claim 10, wherein the at least one starting state is determined to be the same as at least one intermediate state.

13. The computer program product of claim 10, wherein the at least one starting state is determined to precede at least one intermediate state by a pre-determined number of steps in the state-space of the circuit design.

14. The computer program product of claim 10, wherein the plurality of starting states are determined from a subset of the intermediate states corresponding to most recently identified intermediate states.

15. The computer program product of claim 10, wherein an intermediate state definition is satisfied by a plurality of actual concrete states of the circuit design.

16. The computer program product of claim 10, wherein a state definition specifies values for one or more registers of the circuit design or is expressed as a function of a plurality of registers of the circuit design.

17. The computer program product of claim 10, wherein the result comprises a trace that leads to the target state.

18. The computer program product of claim 10, further comprising receiving one or more automatic generated intermediate state definitions for exploring the state-space with the model checking tool.

19. A method for testing a circuit design, the method comprising:
   receiving a circuit design encoded in a hardware description language;
   iteratively exploring, at a model checking tool, a state-space of the circuit design with bounded model checking by performing one or more iterations to identify intermediate states that satisfy intermediate state definitions and a target state that satisfies a target state definition, wherein the intermediate state definitions include user-specified intermediate state definitions, and wherein performing the one or more iterations comprises:
      determining a plurality of starting states in the state-space of the circuit design based on one or more of the intermediate states that are identified in prior iterations and satisfy the intermediate state definitions; and exploring the state-space of the circuit design in parallel from the plurality of starting states; and outputting a result of the iterative exploration, wherein the result includes an indication of whether or not the target state is reachable.

20. A computer program product for testing a circuit design, the computer program product comprising a non-transitory computer-readable storage medium having computer program code stored thereupon, the computer program code, when executed by a computing system, causing the computing system to perform a method for:

receiving a circuit design encoded in a hardware description language;

iteratively exploring, by a model checking tool, a state-space of the circuit design with bounded model checking by performing one or more iterations to identify intermediate states that satisfy intermediate state definitions and a target state that satisfies a target state definition, wherein the intermediate state definitions include user-specified intermediate state definitions, and wherein performing the one or more iterations comprises:

determining a plurality of starting states in the state-space of the circuit design based on one or more of the intermediate states that are identified in prior iterations and satisfy the intermediate state definitions; and exploring the state-space of the circuit design in parallel from the plurality of starting states; and outputting a result of the iterative exploration, wherein the result includes an indication of whether the target state is reachable.

* * * * *